(12) United States Patent
Kim et al.

(10) Patent No.: US 9,184,067 B1
(45) Date of Patent: Nov. 10, 2015

(54) METHODS OF MITIGATING DEFECTS FOR SEMICONDUCTOR PACKAGES

(71) Applicants: KyungHwan Kim, Seoul (KR);
DeokKyung Yang, Hanam-si (KR);
SeongHun Mun, Bucheon-si (KR);
KeoChang Lee, Icheon-si (KR)

(72) Inventors: KyungHwan Kim, Seoul (KR);
DeokKyung Yang, Hanam-si (KR);
SeongHun Mun, Bucheon-si (KR);
KeoChang Lee, Icheon-si (KR)

(73) Assignee: STATS ChipPAC Ltd., Singapore (SG)

( * ) Notice: Subject to any disclaimer, the term of this patent is extended or adjusted under 35 U.S.C. 154(b) by 9 days.

(21) Appl. No.: 14/039,276

(22) Filed: Sep. 27, 2013

(51) Int. Cl.
*H01L 21/56* (2006.01)

(52) U.S. Cl.
CPC ............. *H01L 21/565* (2013.01); *H01L 21/561* (2013.01)

(58) Field of Classification Search
None
See application file for complete search history.

(56) References Cited

U.S. PATENT DOCUMENTS

| | | | |
|---|---|---|---|
| 6,074,897 A | 6/2000 | Degani et al. | |
| 6,369,439 B1 | 4/2002 | Tao et al. | |
| 6,395,097 B1 | 5/2002 | Maheshwari et al. | |
| 6,933,592 B2 | 8/2005 | Liao et al. | |
| 6,969,636 B1 | 11/2005 | Fritz | |
| 7,687,899 B1 * | 3/2010 | Berry | 257/687 |
| 2009/0236752 A1 * | 9/2009 | Lee et al. | 257/777 |
| 2012/0056321 A1 * | 3/2012 | Pagaila | 257/737 |
| 2012/0056329 A1 * | 3/2012 | Pagaila et al. | 257/774 |
| 2012/0217645 A1 * | 8/2012 | Pagaila | 257/774 |

OTHER PUBLICATIONS

Random House, Definition of "length" "Webster's College Dictionary", Copyright 1995, p. 776, Published by Random House, Inc., in New York, and simultaneously in Canada by Random House of Canada Limited Toronto.

* cited by examiner

*Primary Examiner* — Benjamin Sandvik
(74) *Attorney, Agent, or Firm* — Ishimaru & Associates LLP

(57) ABSTRACT

Semiconductor packages with multiple substrates can incorporate apertures or slots between devices to minimize or reduce formation of defects during a molding process. The apertures or slots can be formed adjacent a top substrate in alignment with removable regions adjacent a bottom substrate whereby the apertures or slots can facilitate outflow of materials from cavities between the substrates. The apertures or slots may subsequently be removed in conjunction with the removable regions during a singulation process thereby producing the desired semiconductor packages with improved device reliability and yield.

20 Claims, 6 Drawing Sheets

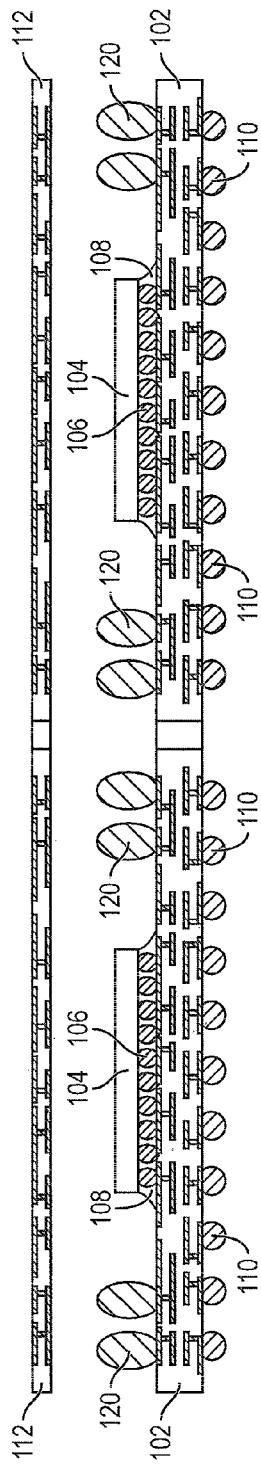
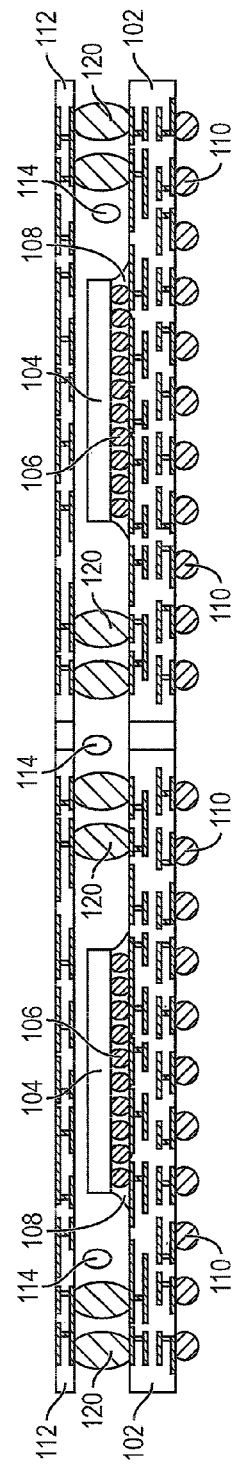
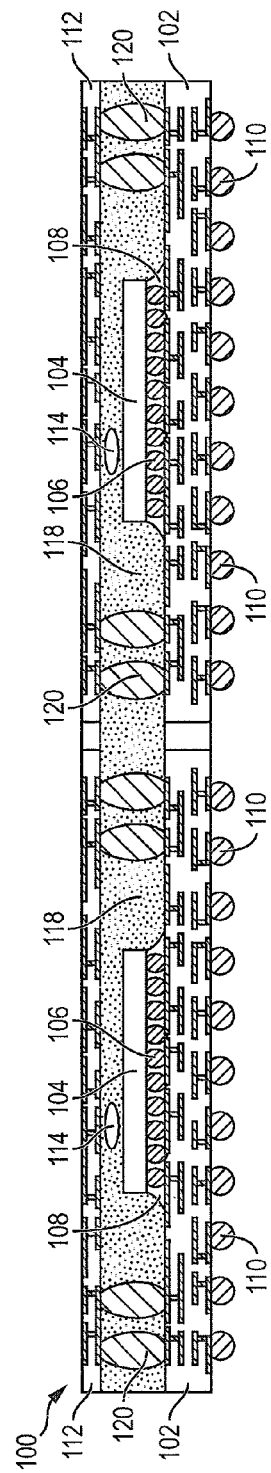
FIG. 1A (PRIOR ART)
FIG. 1B (PRIOR ART)
FIG. 1C (PRIOR ART)

US 9,184,067 B1

METHODS OF MITIGATING DEFECTS FOR SEMICONDUCTOR PACKAGES

TECHNICAL FIELD

The present disclosure relates in general to semiconductor processing and, more particularly, to methods of mitigating voids and other defects from forming during a molding process.

BACKGROUND

Electronic products have become an integral part of our daily lives. Packages of components such as semiconductor circuits, transistors, diodes, and other electronic devices have become smaller and thinner with more functions and connections. In packaging components, the need for coupling components together in a reliable manner can influence the manufacturing processes.

In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

SUMMARY

Semiconductor packages with multiple substrates can incorporate apertures or slots between devices to minimize or reduce formation of defects during a molding process. The apertures or slots can be formed adjacent a top substrate in alignment with removable regions adjacent a bottom substrate whereby the apertures or slots can facilitate outflow of materials from cavities between the substrates. The apertures or slots may subsequently be removed in conjunction with the removable regions during a singulation process thereby producing the desired semiconductor packages with improved device reliability and yield.

In one embodiment, a method of manufacturing a semiconductor package includes providing a first substrate having a first surface and a second surface that is opposite the first surface. Next, the method includes mounting first device and second device on the first surface of the first substrate, where the second device is adjacent the first device. The process is followed by forming first internal interconnects and second internal interconnects on the first surface of the substrate, where the first internal interconnects are between the first device and the second internal interconnects, and where the second internal interconnects are between the second device and the first internal interconnects. The next step involves configuring a removable region between the first device and the second device, where the removable region extends from the first surface to the second surface of the first substrate. Next, the method includes providing a second substrate over the first substrate, where the second substrate has a third surface and a fourth surface that is opposite the third surface, and that the third surface faces the first surface. Subsequently, the method includes forming an aperture between the first device and the second device, where the aperture extends from the third surface to the fourth surface of the second substrate, the aperture being in vertical alignment with the removable region. As such, doing so allows the aperture to be configured to facilitate outflow of materials from cavities between the first substrate and the second substrate.

In one embodiment, the method further includes the step of forming an encapsulation between the first substrate and the second substrate, where the encapsulation encapsulates the first surface, the third surface, the first device, the second device, the first internal interconnects, the second internal interconnects, and the aperture. The encapsulation in this embodiment is substantially free of voids and defects. In another embodiment, the method further includes removing, simultaneously, the removable region and the aperture to form first package and second package, where the first package includes the first device and the first internal interconnects, and where the second package includes the second device and the second internal interconnects.

In one embodiment, the method further includes forming a plurality of external interconnects on the second surface of the first substrate, where the external interconnects are configured to be in communication with at least one of the first device and the second device. In some embodiments, the providing step of the method includes contacting the third surface of the second substrate with the first internal interconnects and the second internal interconnects without the third surface coming into physical contact with the first device or the second device. In other embodiments, the configuring step of the method includes configuring the removable region between the first internal interconnects and the second internal interconnects. In another embodiment, the forming step of the method includes forming the aperture between the first internal interconnects and the second internal interconnects.

In one embodiment, a method of manufacturing a semiconductor package includes providing a first substrate having a first surface and a second surface that is opposite the first surface. Next, the method includes mounting first device and second device on the first surface of the first substrate, where the second device is adjacent the first device. The method is followed by forming first internal interconnects and second internal interconnects on the first surface of the first substrate, where the first internal interconnects are between the first device and the second internal interconnects, and where the second internal interconnects are between the second device and the first internal interconnects. The next step involves configuring a removable region between the first device and the second device, where the removable region extends from the first surface to the second surface of the first substrate. The process can be followed by providing a second substrate over the first substrate, where the second substrate includes a third surface and a fourth surface that is opposite the third surface such that when the second substrate is over the first substrate the third surface is facing the first surface.

Next, the method in this embodiment includes forming an aperture between the first device and the second device with the aperture extending from the third surface to the fourth surface of the second substrate. In this embodiment, the aperture is in vertical alignment with the removable region and is configured to facilitate outflow of materials from cavities between the first substrate and the second substrate. Subsequently, the process flow includes forming an encapsulation between the first substrate and the second substrate, with the encapsulation encapsulating the first surface, the third surface, the first device, the second device, the first internal interconnects, the second internal interconnects, and the aperture. The encapsulation in this example is substantially free of voids and defects.

In some embodiments, the method further includes removing, simultaneously, the removable region, the aperture, and portions of the encapsulation in vertical alignment with the aperture to form first and second packages. The first package includes the first device and the first internal interconnects, while the second package includes the second device and the second internal interconnects. In other embodiments, the method further includes forming a plurality of external interconnects on the second surface, where the external interconnects are configured to be in communication with at least one of the first device and the second device.

In one embodiment, the providing step includes contacting the third surface with the first internal interconnects and the second internal interconnects without the third surface in physical contact with the first device or the second device. In another embodiment, the configuring step includes configuring the removable region between the first internal interconnects and the second internal interconnects. In yet another embodiment, the forming step includes forming the aperture between the first internal interconnects and the second internal interconnects.

In one embodiment, a method of manufacturing a semiconductor package starts with providing a first substrate having a first surface and a second surface that is opposite the first surface. The next step involves mounting a plurality of integrated circuit devices on the first surface of the first substrate, where each of the integrated circuit devices is adjacent to one another. The process is followed by forming a plurality of sets of internal interconnects on the first surface of the first substrate, where each set of internal interconnects is formed around a peripheral region of each integrated circuit device. Subsequently, the method includes configuring a plurality of removable regions, with each removable region adjacent to at least one integrated circuit device and extending from the first surface to the second surface of the first substrate.

In this embodiment, the method includes providing a second substrate over the first substrate, where the second substrate includes a third surface and a fourth surface that is opposite the third surface such that when the second substrate is provided over the first substrate the third surface is facing the first surface. Then, the process flow calls for forming a plurality of slots, where each slot has to be in alignment with at least one removable region, with each slot extending from the third surface to the fourth surface of the second substrate. Next, the method includes forming an encapsulation between the first substrate and the second substrate, where the encapsulation is capable of encapsulating the first surface, the third surface, the plurality of integrated circuit devices, the plurality of sets of internal interconnects, and the plurality of slots. In this embodiment, the encapsulation can be substantially free of voids and defects. Last but not least, the method ends by removing, simultaneously, the plurality of slots, the plurality of removable regions, and portions of the encapsulation in vertical alignment with the plurality of slots and the plurality of removable regions to form a plurality of packages. In this embodiment, each package includes at least one integrated circuit device and at least one set of internal interconnects.

In one embodiment, the method further includes forming a plurality of external interconnects on the second surface of the first substrate, where the external interconnects are configured to be in communication with at least one integrated circuit device. In some embodiments, the forming step includes surrounding each integrated circuit device with at least one set of internal interconnects. In other embodiments, the providing step includes contacting the third surface of the second substrate with the plurality of sets of internal interconnects without the third surface being in physical contact with any of the integrated circuit devices.

In one embodiment, the forming step includes configuring each slot to facilitate outflow of materials from cavities between the first substrate and the second substrate. In some embodiments, the configuring step includes configuring at least one removable region between adjacent sets of internal interconnects. In other embodiments, the forming step includes forming at least one slot between adjacent sets of internal interconnects.

Other variations, embodiments and features of the present disclosure will become evident from the following detailed description, drawings and claims.

BRIEF DESCRIPTION OF THE DRAWINGS

FIGS. 1A-1D are cross-sectional views of a process flow for forming a prior art semiconductor package with multiple substrates;

DETAILED DESCRIPTION OF THE DISCLOSURE

Figure 1D:
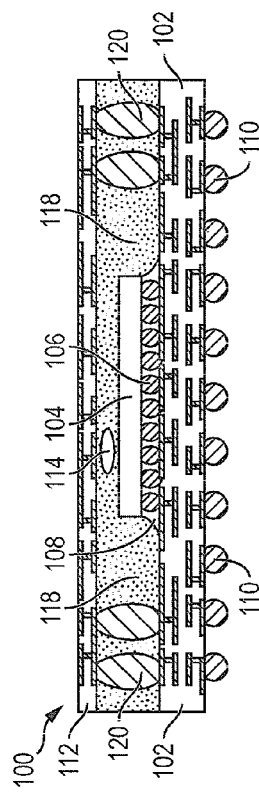

It will be appreciated by those of ordinary skill in the art that the embodiments disclosed herein can be embodied in other specific forms without departing from the spirit or essential character thereof. The presently disclosed embodiments are therefore considered in all respects to be illustrative and not restrictive.

FIGS. 1A-1D are cross-sectional views of a process flow for forming a semiconductor package-on-package (PoP) with multiple substrates known in the prior art. In this instance, the semiconductor PoP 100 includes a bottom substrate 102 and a top substrate 112. The bottom substrate 102 can be a laminate substrate, a printed circuit board (PCB), a silicon substrate, an organic substrate, a ceramic substrate, a plastic substrate, a package carrier, or some other laminated or flexible structure for redistribution of signals. The top substrate 112 can be similar to that of the bottom substrate 102, and vice versa. In the alternative, the top substrate 112 can be an interposer, or a redistribution layer or material, among other suitable semiconductor substrates. Additional integrated circuit devices or packages (not shown) may be formed on an upper surface of the top substrate 112 to form the PoP structure, the integrated circuit devices or packages similar to those described below. For sake of simplicity these devices or packages will not be described in further detail but it will be understood by one skilled in the art that they may be similar to those described below.

Internal interconnects 120 can be formed on an upper or top surface of the substrate 102 to function as conductive or signal connectors while external interconnects 110 can be formed on a lower or bottom surface of the substrate 102 for substantially similar purpose and/or function. The external/internal interconnects 110, 120 can be solder balls, solder bumps, stud bumps, conductive pillars, or other conductive structures. An integrated circuit device 104 can be mounted on the same upper or top surface of the substrate 102 adjacent the internal interconnects 120. The integrated circuit device 104 can be a flip chip, a wire-bond chip or other suitable semiconductor device. In some embodiments, other types of integrated circuit devices 104 including logic, memory, passives, among others, can also be included.

The integrated circuit device 104 can be mounted on the substrate 102 via device interconnects 106 surrounded by an encapsulation 108 such as a molding compound. The device interconnects 106 may be substantially similar to the external/internal interconnects 110, 120 including without limitation solder bumps, solder balls, copper pillars, copper balls, among others. The process of forming the encapsulation 108 can be carried out using film-assisted molding, epoxy molding, moldable underfill or other protective molding process. The encapsulation 108 can protect the integrated circuit device 104 as well as the device interconnects 106 from moisture, dust and other contaminants. Alternatively, instead of device interconnects 106 and encapsulation 108, the integrated circuit device 104 can be attached to the substrate 102 via an adhesive or non-conductive paste material (not shown). In another example, the encapsulation 108 may be optional thereby leaving the integrated circuit device 104 substantially exposed.

In operation, FIG. 1A is a cross-sectional view of a PoP 100 in preparation for a molding process. The top substrate 112 can be brought into contact with the bottom substrate 102 via the plurality of internal interconnects 120 creating a gap or cavity 130 in between as best shown in FIG. 1B in anticipation of the molding compound. The top substrate 112 does not contact the bottom substrate 102 directly but electrical connections or signals may nevertheless be carried out from the bottom substrate 102 or from the integrated circuit device 104 to the top substrate 112 via the plurality of internal interconnects 120. To improve package reliability, a molding compound 118, similar to that of the encapsulation 108, can be introduced into the package 100, to cover or protect the gap or cavity 130 as best shown in FIG. 1C. The molding compound 118 may have similar materials properties as that of the encapsulation 108 and be introduced with similar processes.

Ideally, the cavity 130 would be completely filled by the molding compound 118. However, because the package 100 may be subjected to a deflux process for removing flux residues after a solder ball mount process or forming solder ball joints, flux residues 114 may be trapped within the cavities 130 between the upper and lower substrate 102, 112. As a result, when the molding compound 118 is introduced into the cavities 130 as best illustrated in FIG. 1C, the trapped flux residues may transform into voids or defects 114 leading to reliability as well as yield concerns, as the voids of defects 114 may introduce air bubbles, moistures or other environmental impurities. Subsequently, when the packages 100 are separated by dicing, sawing or similar singulation processes as shown in FIG. 1D, the voids or defects 114 become trapped within the package 100. Accordingly, there is a need to minimize, reduce or eliminate the formation of these voids or defects 114 in a PoP 100.

Figure 2A:
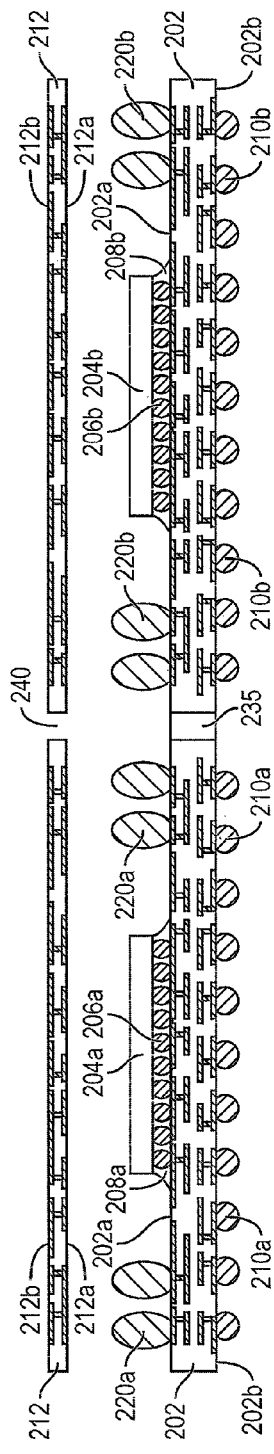
FIGS. 2A-2D are cross-sectional views of a process flow for forming a semiconductor package with multiple substrates according to one embodiment of the present disclosure.
Figure 2B:
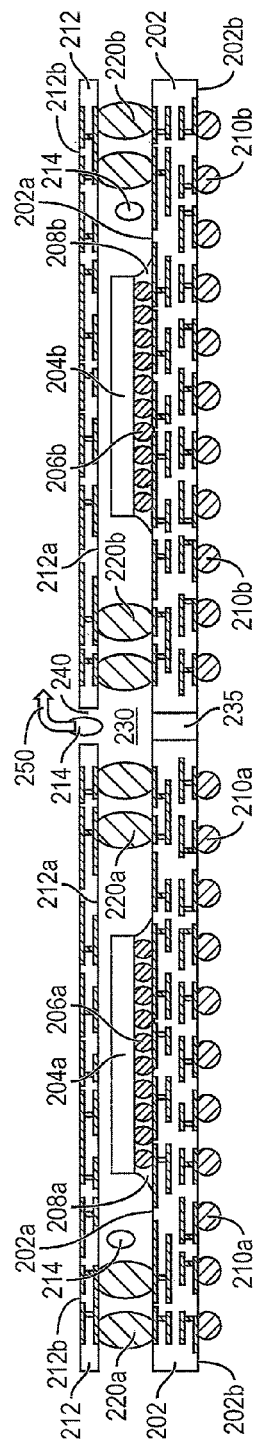

FIGS. 2A-2D are cross-sectional views of a process flow for forming a semiconductor package with multiple substrates according to one embodiment of the present disclosure, where the package 200 helps to mitigation void or defect formation during a molding process. Similar to that discussed above, the semiconductor PoP 200 according to one embodiment of the present disclosure includes a first substrate 202 as shown in FIG. 2A. The first substrate 202 can have a first surface 202a and a second surface 202b, the second surface 202b opposite the first surface 202a. The first substrate 202 can be formed of the materials as discussed above including without limitation silicon, laminate, PCB, organic, ceramic, or plastic.

Adjacent integrated circuit devices 204a, 204b can be mounted on the first surface 202a of the first substrate 202 via a plurality of device interconnects 206a, 206b and partially covered with an encapsulation 208a, 208b similar to that described above. In other words, a first integrated circuit device 204a can be mounted on the first surface 202a with a plurality of device interconnects 206a and partially covered with an encapsulation 208a. Adjacent to the first integrated circuit device 204a is a second integrated circuit device 204b, the second integrated circuit device 204b also mounted on the first surface 202b with its own plurality of device interconnects 206b and partially covered with its own encapsulation 208b. The first integrated circuit device 204a can be adjacent the second integrated circuit device 204b with both devices 204a, 204b mounted on the first surface 202a of the first substrate 202.

Each integrated circuit device 204a, 204b includes its own set of internal interconnects 220a, 220b, the internal interconnects 220 also be formed on the first surface 202a of the first substrate 202 adjacent or around the integrated circuit devices 204. The internal interconnects 220 can be similar to those above including without limitation solder bumps, copper bumps, solder balls or stud bumps. The internal interconnects 220 can be about 125 micron, or about 150 micron, or about 175 micron. The internal interconnects 220 can also be smaller than 100 microns or greater than 200 microns depending on design specifications. Like above, a plurality of external interconnects 210a, 210b can be mounted on the second surface 202b of the first substrate 202, the external interconnects 210a, 210b having similar material properties as those of the internal interconnects 220a, 220b and formed with similar processes.

Although the external interconnects 210 are shown to be formed after the integrated circuit device 204 and the internal interconnects 220, it will be appreciated and understood by one skilled in the art that the order of mounting or attaching the various parts of the package 200 may be interchangeable and be moved around as feasible.

In one embodiment, a first set of internal interconnects 220a can be formed around the first integrated circuit device 204a while a second set of internal interconnects 220b can be formed around the second integrated circuit device 204b. Both sets of internal interconnects 220a, 220b can be formed on the first surface 202a of the first substrate 202. In one embodiment, the first internal interconnects 220a can be disposed between the first integrated circuit device 204a and the second internal interconnects 220b while the second internal interconnects 220b can be disposed between the second integrated circuit device 204b and the first internal interconnects 220a as best illustrated in FIG. 2A.

In one embodiment, each integrated circuit device 204a, 204b includes its own set of external interconnects 210a, 210b, the external interconnects 210 formed on the second surface 202b of the first substrate 202 adjacent the integrated circuit devices 204. For example, a first set of external interconnects 210a can be formed adjacent the first integrated circuit device 204a while a second set of external interconnects 210b can be formed adjacent the second integrated circuit device 204b, the external interconnects 210 being on the second surface 202b of the first substrate 202 opposite those of the integrated circuit devices 204. Nevertheless, the external interconnects 210 are configured to be in communication with at least one of the integrated circuit devices 204, whether the first integrated circuit device 204a or the second integrated circuit device 204b.

A removable region 235 can be configured between the first integrated circuit device 204a and the second integrated circuit device 204b, where the removable region 235 extends from the first surface 202a to the second surface 202b of the first substrate 202. In another embodiment, the removable region 235 can be configured to be between the first internal interconnects 220a and the second internal interconnects 220b. In some instances, the removable region 235 may also be referred to as the saw street or die street. In some examples, the removable region 235 may be a part of the first substrate 202. In other words, the removable region 235 may be delineated from the second substrate 212.

The removable region 235 may be indicated or annotated with a marking or adhesive material to better outline or indicate the region to be removed during subsequent processing. The process for removing the removable region 235 can be carried out by a cutting tool such as a saw. In the alternative, the removable region 235 can be removed by photolithography followed by etching, or other suitable wet etching or dry etching processes. In one embodiment, the removable region 235 can be pre-configured to align with a peripheral or outer region of the integrated circuit device 204. In another example, the removable region 235 can be sized to accommodate the width and/or length of the package 200.

Next, a second or top substrate 212 can be brought into contact with the first or bottom substrate 202, the top substrate 212 of similar material properties as that of the bottom substrate 202. In some embodiments, the top substrate 212 is an interposer substrate or a redistribution layer or film. The top substrate 212 includes a third surface 212a and a fourth surface 212b, where the fourth surface 212b is opposite the third surface 212a. As shown in FIG. 2A, the third surface 212a is facing the first surface 202a as the top substrate 212 is brought into contact with the bottom substrate 202.

In operation, when the top or second substrate 212 is brought into and makes contact with the bottom or first substrate 202, the third surface 212a can come into physical contact with both the first internal interconnects 220a and the second internal interconnects 220b but not either of the integrated circuit devices 204. This can be best illustrated in FIG. 2B, which illustrates the next step in forming the PoP 200 where a slot or aperture 240 can be formed between the first integrated circuit device 204a and the second integrated circuit device 204b, the aperture 240 extending from the third surface 212a to the fourth surface 212b of the second substrate 212. In another embodiment, the aperture 240 can be configured to be between the first internal interconnects 220a and the second internal interconnects 220b. In some examples, the aperture 240 may be a part of the second substrate 212. In other words, the aperture 240 may be partially removed or etched from the second substrate 212.

Although the internal interconnects 220 are shown to be attached to be attached to the first substrate 202, it will be appreciated and understood by one skilled in the art that the internal interconnects 220 can also be initially attached to the second substrate 212 before being brought into contact with the first substrate 202. In other words, the internal interconnects 220 can be first formed on the second substrate 212 and be brought into contact with the first substrate 202.

In one embodiment, the aperture 240 can be formed such that the aperture 240 is in vertical alignment with the removable region 235 as best shown in the figure. Doing so allows any flux 214 that may become trapped to escape through the aperture 240 as indicated by the arrow 250. The trapped flux 214 can come from any part of the cavity 230 between the first substrate 202 and the second substrate 212, whether the flux 214 is adjacent the integrated circuit device 204 or the internal interconnects 220. The aperture 240 is configured to facilitate the outflow of materials 214 from cavities 230 between the first substrate 202 and the second substrate 212.

In some instances, the aperture 240 may also be referred to as the saw street or die street. Like the removable region 235, the aperture 240 may be indicated or annotated with a tape or adhesive material to better outline or indicate the region to be removed during subsequent processing. The process for removing the aperture 240 may be similar to those for the removable region 235 as described above. And like above, the aperture 240 can be pre-configured to align with a peripheral or outer region of the integrated circuit device 204 or sized to accommodate the width and/or length of the package 200.

Figure 2C:
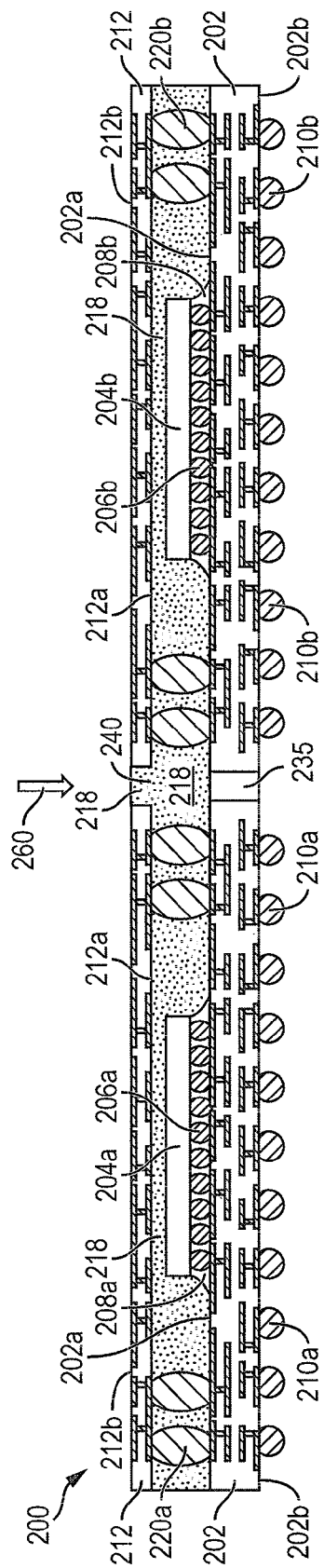

After sufficient time has elapsed, the next step of the process involves forming an encapsulation material 218 as best shown in FIG. 2C. The encapsulation material or molding compound 218 can be introduced from one end of the package 200 to the other end. Alternative materials and/or processes including the likes of mold under fill (MUF), encapsulation molding compound (EMC), vacuum molding or film-assisted molding (FAM) may also be utilized. The molding compound or encapsulation 218 can be formed between the first substrate 202 and the second substrate 212 such that the encapsulation 218 substantially fills the cavity 230 and encapsulates the first surface 202a, the third surface 212a, the first integrated circuit device 204a, the second integrated circuit device 204b, the first internal interconnects 220a as well as the second internal interconnects 220b. In addition, the encapsulation 218 also fills and encapsulates the slot or aperture 240, the encapsulation 218 being substantially free of voids or defects caused by trapped flux or other undesirable materials 214 unable to escape from the cavities 230.

Figure 2D:
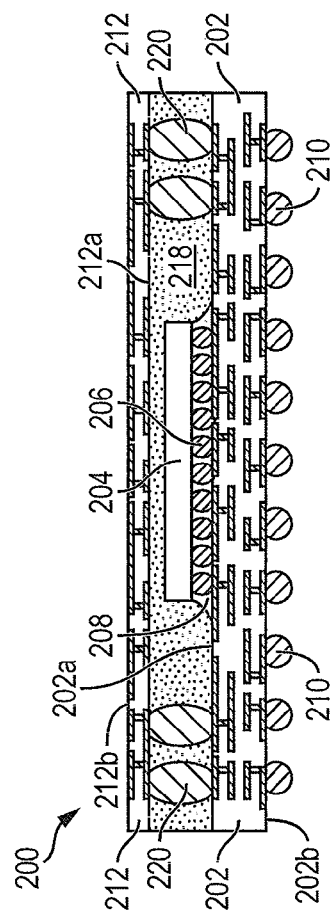

FIG. 2D shows the next step in the process flow where, concomitantly or simultaneously, the removable region 235 and the aperture 240 can be removed by a dicing or sawing process from the alignment point 260. Because the removable region 235 and the aperture 240 are in alignment, this can be carried out with the removal process such as a dice saw or cutting through a saw line with blades as can be appreciated by one skilled in the art. The resulting process, helps to remove any undesirable encapsulation 218 that may be embedded within the aperture 240. The simultaneous removal process also removes any unwanted encapsulation 218 between the aperture 240 and the removable region 235, as well as the simultaneous removal of both the removable region 235 and the aperture 240 in a single process producing a plurality of finished packages 200. Although FIG. 2D shows a generic package 200 having an integrated circuit device 204 and a set of internal interconnects 220, it is understood that cutting through two sets of integrated circuit devices 204a, 204b and internal interconnects 220a, 220b will produce a first package 200a and a second package 200b, where the first package 200a includes the first integrated circuit device 204a with the first internal interconnects 220a while the second package 200b includes the second integrated circuit device 204b with the second internal interconnects 220b.

Figure 3:
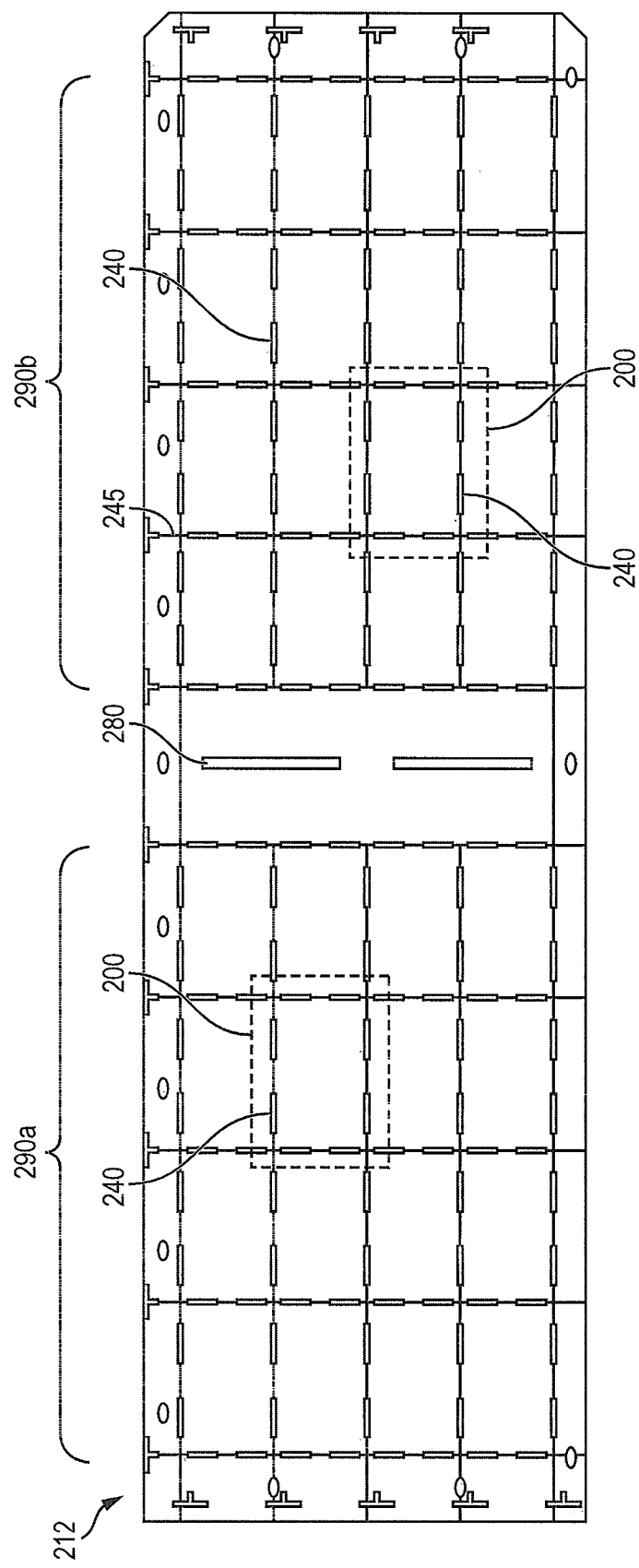
FIG. 3 is a top-down view of the top substrate of FIGS. 2A-2D.

FIG. 3 is a top-down image of the second substrate 212 of FIGS. 2A-2D showing two different segments 290. As shown, the second substrate 212 can include a plurality of saw lines or streets 245 within each segment 290a, 290b, which can be found between neighboring packages 200 or at least on an edge of a package 200. The street 245 can include a plurality of slots or apertures 240 to facilitate the escape of any unwanted flux or other materials 214 from being trapped within the cavities 230 between the substrates 202, 212 as discussed above. In operation, saw streets 245 on the top substrate 212 are aligned with saw streets or removable regions 235 of the bottom substrate 202 such that the corresponding apertures 240 are in alignment with the removable regions 235. Simultaneously removing by dicing or sawing through the slots 240 and the removable regions 235 delivers a finalized package 200 with minimized or mitigated void or defects formation 114 as the flux and other undesirable residues are able to escape from the slots or apertures 240 prior to a molding process with encapsulation 218.

Although the packages 200 as shown in FIG. 3 include two slots 230 on each side for a total of eight slots 230 per package 200, where the slots 230 are used by only one or shared between neighboring packages 200, it is understood that apertures or slots 230 can be formed at the intersection of four packages 200 and be shared among four different packages 200. In the alternative, there need not be two slots 230 on each side but there can be one slot, or three or more slots 230 depending on design specifications and/or constraints. Furthermore, depending on the layout constraints, the slots 230 can be shared among multiple integrated circuit devices 204 and/or packages 200. In some embodiments, slots 280 can be located between segments 290a, 290b for improving warpage control.

Figure 4A:
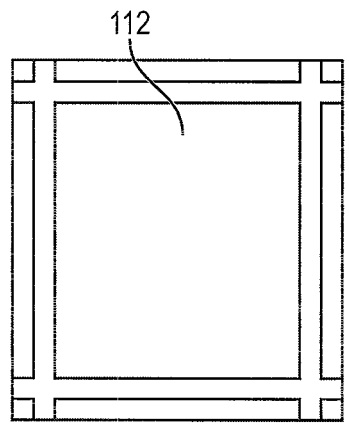
FIG. 4A is a top-down view of the top substrate of FIGS. 1A-1D.
Figure 4B:
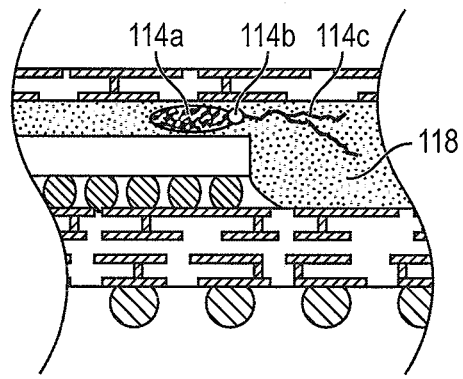
FIG. 4B is a cross-sectional view of a package of FIGS. 1A-1D.

FIG. 4A is a top-down view of the top substrate 112 of FIGS. 1A-1D similar to that of FIG. 3. As shown in the figure, the top substrate 112 does not have any apertures or slots for the flux to escape. As such, the top interposer substrate 112, when coupled to the bottom substrate 102, contains increased risk of flux trapping voids after defluxing because it becomes difficult for the flux to be thoroughly cleaned. The resulting package is one that can be seen in FIG. 4B, which is a cross-sectional view of a package 100 of FIGS. 1A-1D in combination with the top substrate 112 of FIG. 4A. As shown, the flux residues 114a can be found trapped within the molding compound 118 and because the trapped flux residue 114a has different surface energy than the molding compound 118, voids 114b may be formed at the interface between the flux residue 114a and the molding compound 118 leading to cracks 114c within the package. Accordingly, trapped flux residue 114 may cause the formation of void or defects 114 after the encapsulation process 118, such defects likely to lead to early device failure and/or reduced device reliability.

Figure 5A:
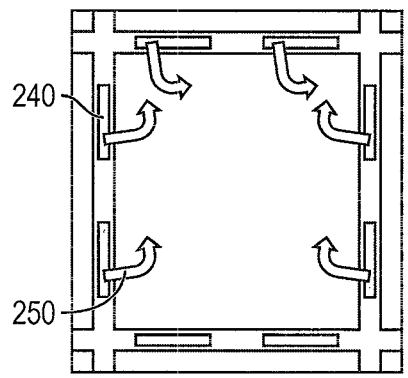
FIG. 5A is a close-up view of FIG. 3.
Figure 5B:
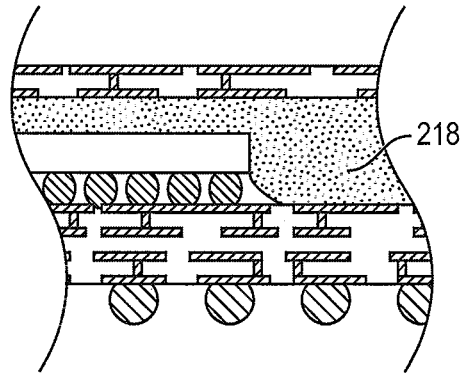
FIG. 5B is a cross-sectional view of a package of FIGS. 2A-2D.

FIG. 5A is a close-up view of FIG. 3 with a particular emphasis on a single package 200. As shown in the figure there are eight slots or apertures 240 although there can be fewer or more apertures as necessary. In operation, the slots or apertures 240 on the outer edges or saw lines of the package 200 can prevent trapping of the flux by serving as vent gates for the flux. In other words, the flux can escape through the plurality of slots or apertures 240. The apertures 240 are smaller in width than the removable regions of the bottom substrate. In other words, the apertures 240 can have an aperture width shorter than an aperture length. The removable regions can have a region width shorter than a region length. The aperture width is smaller than the region width. The resulting package is one that can be seen in FIG. 5B, which is a cross-sectional view of a package 200 of FIGS. 2A-2D, where there are no defects formed within the molding compound 218 because the flux or other unwanted material particles are able to vent or escape from the slots or apertures 240.

Figure 6:
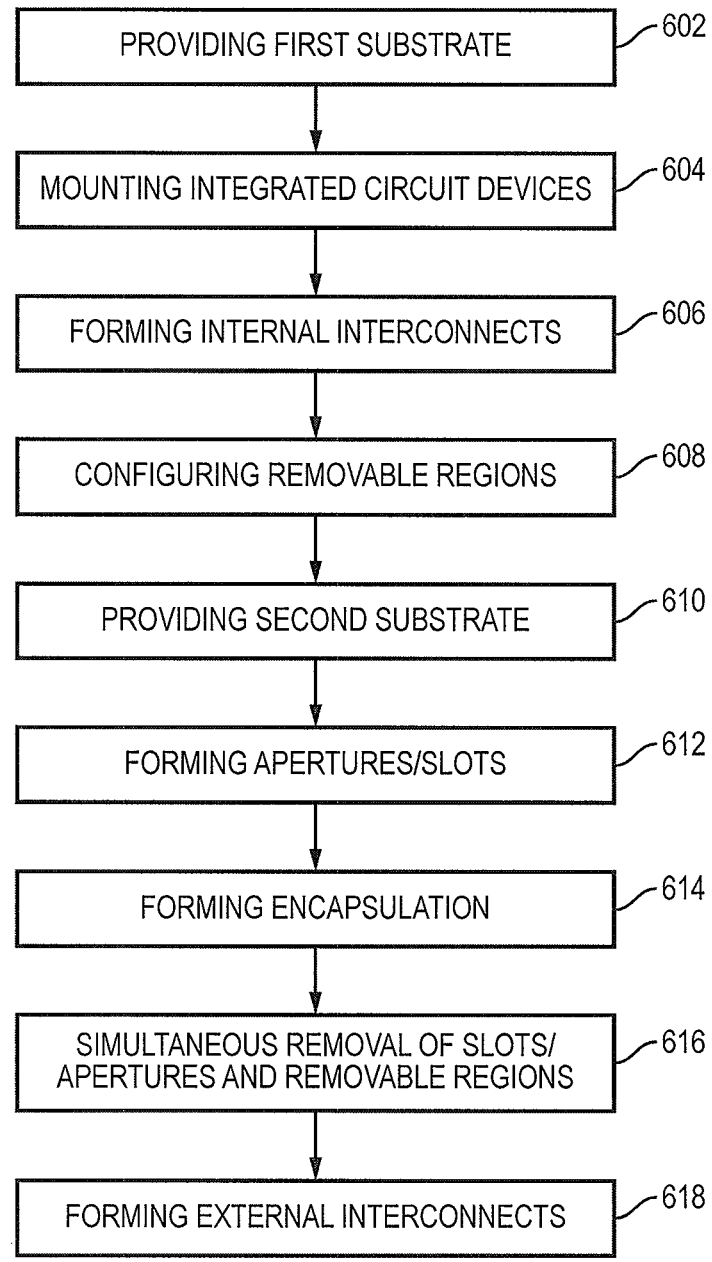
FIG. 6 is a flow diagram of the various process flows for forming a semiconductor package with multiple substrates according to multiple embodiments of the present disclosure.

FIG. 6 is a flow diagram of the various process flows for forming a semiconductor package with multiple substrates according to multiple embodiments of the present disclosure.

In embodiment, a method of mitigating defects for semiconductor packages begins with step 602 of providing a first substrate having a first surface and a second surface opposite the first surface. Next, in step 604, mounting first integrated circuit device and second integrated circuit device on the first surface of the first substrate, where the second integrated circuit device is adjacent the first integrated circuit device. Then, in step 606, forming first internal interconnects and second internal interconnects on the first surface of the first substrate, where the first internal interconnects are between the first integrated circuit device and the second internal interconnects, and where the second internal interconnects are between the second integrated circuit device and the first internal interconnects.

In this embodiment, step 608 includes configuring a removable region between the first integrated circuit device and the second integrated circuit device, where the removable region extends from the first surface of the first substrate to the second surface of the first substrate. Next, in step 610, providing a second substrate over the first substrate, where the second substrate includes a third surface and a fourth surface opposite the third surface such that the third surface faces the first surface of the first substrate. Last but not least, in step 612, forming an aperture between the first integrated circuit device and the second integrated circuit device, such that the aperture extends from the third surface of the second substrate to the fourth surface of the second substrate. In one embodiment, the aperture is in vertical alignment with the removable region, and the aperture is configured to facilitate outflow of materials from cavities between the first substrate and the second substrate.

In another embodiment, the method further includes step 614 of forming an encapsulation between the first substrate and the second substrate, the encapsulation capable of encapsulating the first surface of the first substrate, the third surface of the second substrate, the first integrated circuit device, and the second integrated circuit device. The encapsulation is further capable of encapsulating the first internal interconnects, the second internal interconnects, and the aperture. The encapsulation, in this instance, is substantially free of voids and defects.

In another embodiment, the method further includes step 616 of removing, simultaneously, the removable region and the aperture to form first package and second package. The first package includes the first integrated circuit device and the first internal interconnects while the second package includes the second integrated circuit device and the second internal interconnects.

In yet another embodiment, the method further includes step 618 of forming a plurality of external interconnects on the second surface of the first substrate, the external interconnects configured to be in communication with at least one of the first integrated circuit device and the second integrated circuit device.

In some embodiments, the providing step 610 includes contacting the third surface of the second substrate with the first internal interconnects and the second internal interconnects. However, in these instances, the third surface is not in physical contact with either the first integrated circuit device or the second integrated circuit device.

In other embodiments, the configuring step 608 includes configuring the removable region to be between the first internal interconnects and the second internal interconnects, while the forming step 612 includes forming the aperture between the first internal interconnects and the second internal interconnects.

In one embodiment, a method of mitigating defects for semiconductor packages begins with step 602 of providing a first substrate having a first surface and a second surface opposite the first surface. Next, in step 604, mounting first integrated circuit device and second integrated circuit device on the first surface of the first substrate, where the second integrated circuit device is adjacent the first integrated circuit device. Then, in step 606, forming first internal interconnects and second internal interconnects on the first surface of the first substrate, where the first internal interconnects are between the first integrated circuit device and the second internal interconnects, and where the second internal interconnects are between the second integrated circuit device and the first internal interconnects. Subsequently, step 608 includes configuring a removable region between the first integrated circuit device and the second integrated circuit device, where the removable region extends from the first surface of the first substrate to the second surface of the first substrate, while step 610 includes providing a second substrate over the first substrate, where the second substrate includes a third surface and a fourth surface opposite the third surface such that the third surface faces the first surface of the first substrate. Next, in step 612, forming an aperture between the first integrated circuit device and the second integrated circuit device, such that the aperture extends from the third surface of the second substrate to the fourth surface of the second substrate, where the aperture is in vertical alignment with the removable region, and whereby the aperture is configured to facilitate outflow of materials from cavities between the first substrate and the second substrate. Last but not least, the method includes step 614 of forming an encapsulation between the first substrate and the second substrate, the encapsulation capable of encapsulating the first surface of the first substrate, the third surface of the second substrate, the first integrated circuit device, and the second integrated circuit device. The encapsulation is also capable of encapsulating the first internal interconnects, the second internal interconnects, and the aperture, where the encapsulation is, in this instance, substantially free of voids and defects.

In another embodiment, the method further includes step 616 of removing, simultaneously, the removable region and the aperture to form first package and second package. The first package includes the first integrated circuit device and the first internal interconnects while the second package includes the second integrated circuit device and the second internal interconnects.

In yet another embodiment, the method further includes step 618 of forming a plurality of external interconnects on the second surface of the first substrate, the external interconnects configured to be in communication with at least one of the first integrated circuit device and the second integrated circuit device.

In some embodiments, the providing step 610 includes contacting the third surface of the second substrate with the first internal interconnects and the second internal interconnects. However, in these instances, the third surface is not in physical contact with either the first integrated circuit device or the second integrated circuit device.

In other embodiments, the configuring step 608 includes configuring the removable region to be between the first internal interconnects and the second internal interconnects, while the forming step 612 includes forming the aperture between the first internal interconnects and the second internal interconnects.

In one embodiment, a method of mitigating defects for semiconductor packages begins with step 602 of providing a first substrate having a first surface and a second surface opposite the first surface. Next, in step 604, mounting a plurality of integrated circuit devices on the first surface of the first substrate, where each integrated circuit device is adjacent to one another. Then, in step 606, forming a plurality of sets of internal interconnects on the first surface of the first substrate, where each set of internal interconnects are formed around a peripheral region of each integrated circuit device. Subsequently, step 608 includes configuring a plurality of removable regions, where each removable region is adjacent at least one integrated circuit device and extending from the first surface of the first substrate to the second surface of the first substrate. Next, step 610 includes providing a second substrate over the first substrate, where the second substrate includes a third surface and a fourth surface opposite the third surface such that the third surface faces the first surface of the first substrate.

Then, in step 612, forming a plurality of slots in alignment with at least one removable region, each slot extending from the third surface of the second substrate to the fourth surface of the second substrate. Followed by step 614 of forming an encapsulation between the first substrate and the second substrate, the encapsulation capable of encapsulating the first surface of the first substrate, the third surface of the second substrate. The encapsulation, in this instance, is also capable of encapsulating the plurality of integrated circuit devices, the plurality of sets of internal interconnects, and the plurality of slots, such that the encapsulation is, in this embodiment, substantially free of voids and defects. Last but not least, step 616 involves removing, simultaneously, the plurality of slots, the plurality of removable regions, and the portions of the encapsulation in vertical alignment with the plurality of slots and the plurality of removable regions to form a plurality of packages, where each package includes at least one integrated circuit device and a set of internal interconnects.

In yet another embodiment, the method further includes step 618 of forming a plurality of external interconnects on the second surface of the first substrate, the external interconnects configured to be in communication with at least one integrated circuit device.

In some embodiments, the forming step 606 includes surrounding each integrated circuit device with at least one set of internal interconnects. In other embodiments, the providing step 610 includes contacting the third surface of the second substrate with the plurality of sets of internal interconnects without the third surface coming into physical contact with any integrated circuit device.

In one embodiment, the forming step 612 includes configuring each slot to facilitate outflow of materials from cavities between the first substrate and the second substrate. In another embodiment, the configuring step 608 includes configuring at least one removable region between adjacent sets of internal interconnects. In yet another embodiment, the forming step 612 includes forming at least one slot between adjacent sets of internal interconnects.

Although the current description has been described in detail with reference to several embodiments, additional variations and modifications exist within the scope and spirit of the disclosure.

What is claimed is:

1. A method comprising:
    providing a first substrate having a first surface and a second surface opposite the first surface;
    mounting first device and second device on the first surface, the second device adjacent the first device;
    forming first internal interconnects and second internal interconnects on the first surface, the first internal interconnects between the first device and the second internal interconnects and the second internal interconnects between the second device and the first internal interconnects;

configuring a removable region between the first device and the second device, the removable region extending from the first surface to the second surface of the first substrate, the removable region having a region length longer than a region width;

providing a second substrate over the first substrate, the second substrate having a third surface and a fourth surface opposite the third surface such that the third surface faces the first surface;

forming an aperture between the first device and the second device, the aperture extending from the third surface to the fourth surface of the second substrate, the aperture in vertical alignment with the removable region, the aperture having an aperture width smaller than the region width of the removable region; and wherein the aperture is configured to facilitate outflow of materials from cavities between the first substrate and the second substrate.

2. The method of claim 1, further comprising:

forming an encapsulation between the first substrate and the second substrate, the encapsulation encapsulating the first surface, the third surface, the first device, the second device, the first internal interconnects, the second internal interconnects, and the aperture, the encapsulation substantially free of voids and defects.

3. The method of claim 1, further comprising:

removing, simultaneously, the removable region and the aperture to form first package and second package, the first package having the first device and the first internal interconnects and the second package having the second device and the second internal interconnects.

4. The method of claim 1, further comprising:

forming a plurality of external interconnects on the second surface, the external interconnects configured to be in communication with at least one of the first device and the second device.

5. The method of claim 1, wherein providing the second substrate includes contacting the third surface with the first internal interconnects and the second internal interconnects, the third surface not in physical contact with the first device or the second device.

6. The method of claim 1, wherein configuring the removable region includes configuring the removable region between the first internal interconnects and the second internal interconnects.

7. The method of claim 1, wherein forming the aperture includes forming the aperture between the first internal interconnects and the second internal interconnects.

8. A method comprising:

providing a first substrate having a first surface and a second surface opposite the first surface;

mounting first device and second device on the first surface, the second device adjacent the first device;

forming first internal interconnects and second internal interconnects on the first surface, the first internal interconnects between the first device and the second internal interconnects and the second internal interconnects between the second device and the first internal interconnects;

configuring a removable region between the first device and the second device, the removable region extending from the first surface to the second surface of the first substrate, the removable region having a region length longer than a region width;

providing a second substrate over the first substrate, the second substrate having a third surface and a fourth surface opposite the third surface such that the third surface faces the first surface;

forming an aperture between the first device and the second device, the aperture extending from the third surface to the fourth surface of the second substrate, the aperture in vertical alignment with the removable region and configured to facilitate outflow of materials from cavities between the first substrate and the second substrate, the aperture having an aperture width smaller than the region width of the removable region; and forming an encapsulation between the first substrate and the second substrate, the encapsulation encapsulating the first surface, the third surface, the first device, the second device, the first internal interconnects, the second internal interconnects, and the aperture, the encapsulation substantially free of voids and defects.

9. The method of claim 8, further comprising:

removing, simultaneously, the removable region, the aperture, and portions of the encapsulation in vertical alignment with the aperture to form first package and second package, the first package having the first device and the first internal interconnects and the second package having the second device and the second internal interconnects.

10. The method of claim 8, further comprising:

forming a plurality of external interconnects on the second surface, the external interconnects configured to be in communication with at least one of the first device and the second device.

11. The method of claim 8, wherein providing the second substrate includes contacting the third surface with the first internal interconnects and the second internal interconnects, the third surface not in physical contact with the first device or the second device.

12. The method of claim 8, wherein configuring the removable region includes configuring the removable region between the first internal interconnects and the second internal interconnects.

13. The method of claim 8, wherein forming the aperture includes forming the aperture between the first internal interconnects and the second internal interconnects.

14. A method comprising:

providing a first substrate having a first surface and a second surface opposite the first surface;

mounting a plurality of integrated circuit devices on the first surface, each integrated circuit device adjacent to one another;

forming a plurality of sets of internal interconnects on the first surface, each set of internal interconnects formed around a peripheral region of each integrated circuit device;

configuring a plurality of removable regions, each removable region adjacent to at least one integrated circuit device and extending from the first surface to the second surface of the first substrate, the removable region having a region length longer than a region width;

providing a second substrate over the first substrate, the second substrate having a third surface and a fourth surface opposite the third surface such that the third surface faces the first surface;

forming a plurality of slots in alignment with at least one removable region, each slot extending from the third surface to the fourth surface of the second substrate, the plurality of slots having an aperture width smaller than the region width of the removable regions;

forming an encapsulation between the first substrate and the second substrate, the encapsulation encapsulating the first surface, the third surface, the plurality of integrated circuit devices, the plurality of sets of internal interconnects, and the plurality of slots, the encapsulation substantially free of voids and defects; and removing, simultaneously, the plurality of slots, the plurality of removable regions, and portions of the encapsulation in vertical alignment with the plurality of slots and the plurality of removable regions to form a plurality of packages, each package having at least one integrated circuit device and a set of internal interconnects.

15. The method of claim 14, further comprising:
forming a plurality of external interconnects on the second surface, the external interconnects configured to be in communication with at least one integrated circuit device.

16. The method of claim 14, wherein forming the plurality of sets of internal interconnects includes surrounding each integrated circuit device with at least one set of internal interconnects.

17. The method of claim 14, wherein providing the second substrate includes contacting the third surface with the plurality of sets of internal interconnects, the third surface not in physical contact with any integrated circuit device.

18. The method of claim 14, wherein forming the plurality of slots includes configuring each slot to facilitate outflow of materials from cavities between the first substrate and the second substrate.

19. The method of claim 14, wherein configuring the plurality of removable regions includes configuring at least one removable region between adjacent sets of internal interconnects.

20. The method of claim 14, wherein forming the plurality of slots includes forming at least one slot between adjacent sets of internal interconnects.

\* \* \* \* \*